United States Patent
Liu et al.

(10) Patent No.: US 10,938,359 B1
(45) Date of Patent: Mar. 2, 2021

(54) POWER AMPLIFIER AND METHOD OF OPERATING THE POWER AMPLIFIER

(71) Applicant: Beken Corporation, Shanghai (CN)

(72) Inventors: Jiazhou Liu, Shanghai (CN); Donghui Gao, Shanghai (CN)

(73) Assignee: Beken Corporation, Shanghai (CN)

( * ) Notice: Subject to any disclaimer, the term of this patent is extended or adjusted under 35 U.S.C. 154(b) by 56 days.

(21) Appl. No.: 16/574,633

(22) Filed: Sep. 18, 2019

(30) Foreign Application Priority Data

Aug. 13, 2019 (CN) .......................... 201910744588.4

(51) Int. Cl.
*H03F 3/45* (2006.01)
*H03F 3/217* (2006.01)
*H03F 3/42* (2006.01)

(52) U.S. Cl.
CPC ........... *H03F 3/2171* (2013.01); *H03F 3/423* (2013.01)

(58) Field of Classification Search
CPC ....................................................... H03F 3/45
USPC .................................................. 330/260, 252
See application file for complete search history.

(56) References Cited

U.S. PATENT DOCUMENTS

| | | | |
|---|---|---|---|
| 9,866,187 B2 * | 1/2018 | Liu .......................... | H03F 3/183 |
| 2013/0033319 A1 * | 2/2013 | Chen ........................ | H03F 3/217 |
| | | | 330/251 |
| 2020/0295721 A1 * | 9/2020 | Kitazawa ............ | H04L 25/0282 |

OTHER PUBLICATIONS

"Designing Practical High Performance Class D Audio Amplifier", www.irf.com > product-info > audio > classdtutorial606 [retrieved Jan. 23, 2019], (Jan. 23, 2019), 51 pgs.
Jiang, Xicheng, et al., "Integrated Class-D Audio Amplifier With 95% Efficiency and 105 dB SNR", IEEE Journal of Solid-State Circuits, vol. 49, No. 11, Nov. 2014, (Nov. 2014), 2387-2396.
Oliveira, Daniel, et al., "Design of a Current-Mode Class-D Power Amplifier in RF-CMOS", (2019), 6 pgs.
Taranovich, Steve, "Class D audio power amplifiers: Adding punch to your sound design", https://www.edn.com/design/power-management/4443229/Class-D-audio-power-amplifiers—Adding-punch-to-your-sound-design [retrieved Jan. 2019], (Jan. 3, 2017), 15 pgs.

* cited by examiner

*Primary Examiner* — Henry Choe
(74) *Attorney, Agent, or Firm* — Schwegman Lundberg & Woessner, P.A.

(57) ABSTRACT

A power amplifier includes an operational amplifier, a ramp generator communicatively coupled to both a first comparator and a second comparator; the first comparator further communicatively coupled to a negative output port of the operational amplifier; the second comparator further communicatively coupled to a positive output port of the operational amplifier; a first inverter communicatively coupled to the first comparator; a second inverter communicatively coupled to the second comparator; wherein the first inverter is communicatively coupled to both a positive input port of the operational amplifier via a first resistor and coupled to a negative input port of the operational amplifier via a fourth resistor; and the second inverter is communicatively coupled to both the positive input port of the operational amplifier via a second resistor and connected to the negative input port of the operational amplifier via a third resistor.

18 Claims, 7 Drawing Sheets

Vop

Von

Vopp + Vopn wave caused by FIG. 5A

FIG. 5C

Vopp' + Vopn' wave caused by FIG. 5B

FIG. 5D

Vopp" + Vopn" wave according to embodiment of the present invention

POWER AMPLIFIER AND METHOD OF OPERATING THE POWER AMPLIFIER

CLAIM OF PRIORITY

This disclosure claims priority to Chinese Application number 201910744588.4 entitled "Power Amplifier and Method of Operating the Power Amplifier," filed on Aug. 13, 2019 by Beken Corporation, which is incorporated herein by reference.

TECHNICAL FIELD

This disclosure relates to power amplifiers and more particularly, but not exclusively, to class-D amplifiers.

BACKGROUND

A Class-D amplifier, or so-called switching amplifier, transforms the input signal to output pulses using for example, a pulse-width modulation (PWM) technique. A convention class-D power amplifier may use a pair of low pass filters (LPF) to respectively feed negative output and positive output back to a positive input port and negative input port of an operational amplifier within the class-D power amplifier, so as to suppress common-mode jitter. However, the conventional class-D power amplifier, with the introduction of the LPF, which may comprise an operational amplifier, will inadvertently increase noises and current.

SUMMARY

An embodiment provides a power amplifier comprising an operational amplifier, a ramp generator, a first comparator, a second comparator, a first inverter, and a second inverter. The operational amplifier is configured to output a positive amplifying output and a negative amplifying output based on a positive input and a negative input. The ramp generator is communicatively coupled to both negative inputs of a first comparator and a second comparator, and configured to generate a ramp signal. The positive input port of the first comparator is further communicatively coupled to a negative output port of the operational amplifier and the first comparator is further configured to generate a first decision result by comparing the first negative output of the operational amplifier and the ramp signal. The positive input port of the second comparator is further communicatively coupled to a positive output port of the operational amplifier and the second comparator is further configured to generate a second decision result by comparing the first positive output of the operational amplifier and the ramp signal. The first inverter is communicatively coupled to the first comparator and configured to output a first inverted output by inverting the first decision result. The second inverter is communicatively coupled to the second comparator and configured to output a second inverted output by inverting the second decision result. The output port of the first inverter is communicatively coupled to both the positive input port of the operational amplifier via a first resistor and connected to the negative input port of the operational amplifier via a fourth resistor and configured to feed the first inverted output back to the positive input port of the operational amplifier and the negative input port of the operational amplifier; and an output port of the second inverter is communicatively coupled to both the positive input port of the operational amplifier via a second resistor and connected to the negative input port of the operational amplifier via a third resistor and configured to feed the second inverted output back to the positive input port of the operational amplifier and the negative input port of the operational amplifier.

In an embodiment, the first inverter comprises a first PMOS transistor and a first NMOS transistor, and the second inverter comprises a second PMOS transistor and a second NMOS transistor. A source of the first PMOS transistor is connected to a power supply, and a gate of the first PMOS transistor is connected to an output of the first comparator, and a drain of the first PMOS transistor is connected to a drain of the first NMOS transistor, to both the positive input port of the operational amplifier via the first resistor and the negative input port of the operational amplifier via the fourth resistor. A gate of the first NMOS transistor is connected to the output of the first comparator, and a source of the first NMOS transistor is connected to the ground. A source of the second PMOS transistor is connected to the power supply, and a gate of the second PMOS transistor is connected to an output of the second comparator, and a drain of the second PMOS transistor is connected to a drain of the second NMOS transistor, to both the positive input port of the operational amplifier via the second resistor and the negative input port of the operational amplifier via the third resistor; and a gate of the second NMOS transistor is connected to the output of the second comparator, and a source of the second NMOS transistor is connected to the ground.

In an embodiment, the power amplifier further comprises a first buffer and a second buffer. The first buffer communicatively coupled to an output of the first comparator and the first inverter and configured to generate a negative output voltage by buffering the first decision result. The second buffer communicatively coupled to an output of the second comparator and the second inverter and configured to generate a positive output voltage by buffering the second decision result, wherein the first inverter is further configured to output the first inverted output by inverting the negative output voltage; and the second inverter is further configured to output the second inverted output by inverting the positive output voltage.

In an embodiment, the first buffer comprises a third PMOS transistor, a third NMOS transistor, a fourth PMOS transistor and a fourth NMOS transistor, wherein a source of the third PMOS transistor is connected to the power supply, and a gate of the third PMOS transistor is connected to the output of the first comparator, and a drain of the third PMOS transistor is connected to a drain of the third NMOS transistor, a gate of the fourth PMOS transistor and a gate of the fourth NMOS transistor. A gate of the third NMOS transistor is connected to the output of the first comparator, and a source of the third NMOS transistor is connected to a ground. A source of the fourth PMOS transistor is connected to the power supply, and a drain of the fourth PMOS transistor is connected to a drain of the fourth NMOS transistor and configured to output the negative output voltage. A source of the fourth NMOS transistor is connected to the ground.

In an embodiment, the second buffer comprises a fifth PMOS transistor, a fifth NMOS transistor, a sixth PMOS transistor and a sixth NMOS transistor, wherein a source of the fifth PMOS transistor is connected to the power supply, and a gate of the fifth PMOS transistor is connected to the output of the second comparator, and a drain of the fifth PMOS transistor is connected to a drain of the fifth NMOS transistor, a gate of the sixth PMOS transistor and a gate of the sixth NMOS transistor. A gate of the fifth NMOS transistor is connected to the output of the second comparator, and a source of the fifth NMOS transistor is connected to a ground. A source of the sixth PMOS transistor is connected to the power supply, and a drain of the sixth PMOS transistor is connected to a drain of the sixth NMOS transistor and configured to output the positive output voltage. A source of the sixth NMOS transistor is connected to the ground.

In an embodiment, the output port of the first buffer is further communicatively coupled to a positive input port of the operational amplifier, and the output port of the second buffer is further communicatively coupled to a positive input port of the operational amplifier.

In an embodiment, the output port of the first comparator is further communicatively coupled to the positive input port of the operational amplifier via a first reference resistor, and the output port of the second comparator is further communicatively coupled to the positive input port of the operational amplifier via a second reference resistor.

In an embodiment, the ramp generator is a triangle wave generator.

In an embodiment, the ramp generator is a jigsaw wave generator.

Another embodiment provides a method of operating a power amplifier, comprising outputting, by an operational amplifier, a positive amplifying output and a negative amplifying output based on a positive input and a negative input; generating, by a ramp generator communicatively coupled to both negative inputs of a first comparator and a second comparator, a ramp signal; generating, by the first comparator communicatively coupled to a negative output port of the operational amplifier, a first decision result by comparing the negative amplifying output of the operational amplifier and the ramp signal; generating, by the second comparator communicatively coupled to a positive output port of the operational amplifier and the second comparator, a second decision result by comparing the positive amplifying output of the operational amplifier and the ramp signal; generating, by a first inverter communicatively coupled to the first comparator, a first inverted output by inverting the first decision result; generating, by a second inverter communicatively coupled to the second comparator, a second inverted output by inverting the second decision result; feeding, by an output port of the first inverter communicatively coupled to both a positive input port of the operational amplifier via a first resistor and communicatively coupled to a negative input port of the operational amplifier via a fourth resistor, the first inverted output back to the positive input port of the operational amplifier and the negative input port of the operational amplifier; and feeding, by an output port of the second inverter communicatively coupled to both the positive input port of the operational amplifier via a second resistor and communicatively coupled to the negative input port of the operational amplifier via a third resistor, the second inverted output back to the positive input port of the operational amplifier and the negative input port of the operational amplifier.

In an embodiment of the method of operating a power amplifier, the first inverter comprises a first PMOS transistor and a first NMOS transistor, and the second inverter comprises a second PMOS transistor and a second NMOS transistor. A source of the first PMOS transistor is connected to a power supply, and a gate of the first PMOS transistor is connected to an output of the first comparator, and a drain of the first PMOS transistor is connected to a drain of the first NMOS transistor, to both the positive input port of the operational amplifier via the first resistor and the negative input port of the operational amplifier via the fourth resistor. A gate of the first NMOS transistor is connected to the output of the first comparator, and a source of the first NMOS transistor is connected to the ground. A source of the second PMOS transistor is connected to the power supply, and a gate of the second PMOS transistor is connected to an output of the second comparator, and a drain of the second PMOS transistor is connected to a drain of the second NMOS transistor, to both the positive input port of the operational amplifier via the second resistor and the negative input port of the operational amplifier via the third resistor. A gate of the second NMOS transistor is connected to the output of the second comparator, and a source of the second NMOS transistor is connected to the ground.

In an embodiment, the method of operating a power amplifier further comprises generating and outputting, by a first buffer communicatively coupled to the output of the first comparator, a negative output voltage by buffering the first decision result; generating and outputting, by a second buffer communicatively coupled to the output of the second comparator, a positive output voltage by buffering the second decision result; generating, by the first inverter communicatively coupled to the first buffer, a first inverted output by inverting the negative output voltage; generating, by a second inverter communicatively coupled to the second comparator, a second inverted output by inverting the positive output voltage.

In an embodiment of the method of operating a power amplifier, the first buffer comprises a third PMOS transistor, a third NMOS transistor, a fourth PMOS transistor and a fourth NMOS transistor, wherein a source of the third PMOS transistor is connected to the power supply, and a gate of the third PMOS transistor is connected to the output of the first comparator, and a drain of the third PMOS transistor is connected to a drain of the third NMOS transistor, a gate of the fourth PMOS transistor and a gate of the fourth NMOS transistor; a gate of the third NMOS transistor is connected to the output of the first comparator, and a source of the third NMOS transistor is connected to a ground; a source of the fourth PMOS transistor is connected to the power supply, and a drain of the fourth PMOS transistor is connected to a drain of the fourth NMOS transistor and configured to output the negative output voltage; and a source of the fourth NMOS transistor is connected to the ground.

In an embodiment of the method of operating a power amplifier, the second buffer comprises a fifth PMOS transistor, a fifth NMOS transistor, a sixth PMOS transistor and a sixth NMOS transistor, wherein a source of the fifth PMOS transistor is connected to the power supply, and a gate of the fifth PMOS transistor is connected to the output of the second comparator, and a drain of the fifth PMOS transistor is connected to a drain of the fifth NMOS transistor, a gate of the sixth PMOS transistor and a gate of the sixth NMOS transistor; a gate of the fifth NMOS transistor is connected to the output of the second comparator, and a source of the fifth NMOS transistor is connected to a ground; a source of the sixth PMOS transistor is connected to the power supply, and a drain of the sixth PMOS transistor is connected to a drain of the sixth NMOS transistor and configured to output the positive output voltage; and a source of the sixth NMOS transistor is connected to the ground.

In an embodiment of the method of operating a power amplifier, the output port of the first buffer is further communicatively coupled to the positive input port of the operational amplifier, and the output port of the second buffer is further communicatively coupled to the positive input port of the operational amplifier.

In an embodiment of the method of operating a power amplifier, the output port of the first comparator is further communicatively coupled to the positive input port of the operational amplifier via a first reference resistor, and the output port of the second comparator is further communicatively coupled to the positive input port of the operational amplifier via a second reference resistor.

In an embodiment of the method of operating a power amplifier, the ramp generator is a triangle wave generator.

In an embodiment of the method of operating a power amplifier, the ramp generator is a jigsaw wave generator.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Various aspects and examples will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this Detailed Description section.

Figure 1:
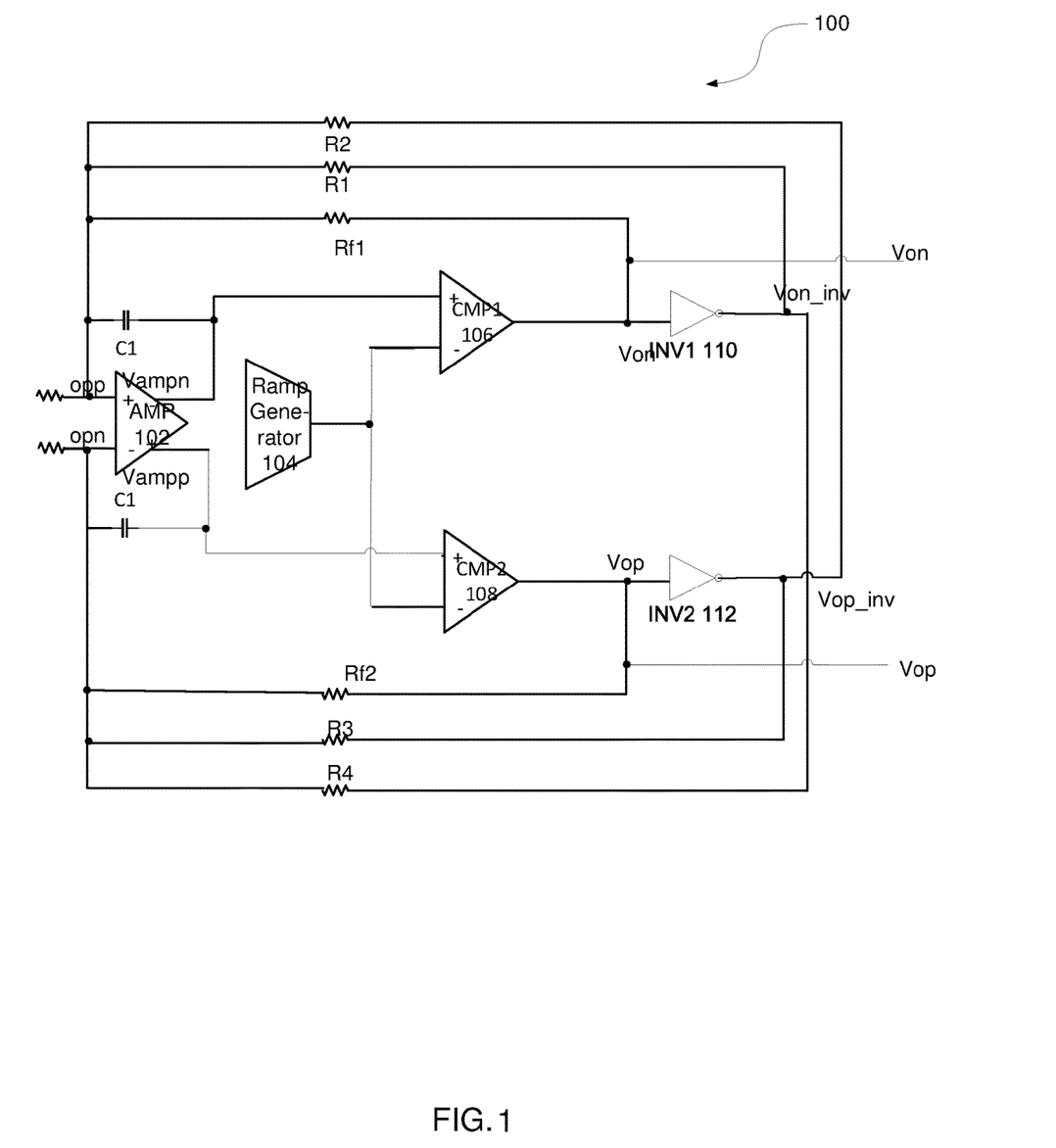
FIG. 1 is a circuit diagram of a power amplifier according to an embodiment.

FIG. 1 is a circuit diagram of a power amplifier 100 according to an embodiment. The power amplifier 100 comprises an operational amplifier 102, a ramp generator 104, a first comparator 106, a second comparator 108, a first inverter 110 and a second inverter 112. The operational amplifier 102 is configured to output a positive amplifying output Vampp and a negative amplifying output Vampn based on a positive input opp and a negative input opn. The ramp generator 104 is communicatively coupled to both negative inputs of a first comparator 106 and a second comparator 108, and configured to generate a ramp signal. A positive input port of the first comparator 106 is further communicatively coupled to a negative output port of the operational amplifier 102 and the first comparator 106 is further configured to generate a first decision result Von by comparing the negative amplifying output Vampn of the operational amplifier 102 and the ramp signal. A positive input port of the second comparator 108 is further communicatively coupled to a positive output port of the operational amplifier 102 and the second comparator 108 is further configured to generate a second decision result Vop by comparing the positive amplifying output Vampp of the operational amplifier 102 and the ramp signal. The first and the second decision results Von and Vop are also the outputs of the power amplifier 100.

Further, the output port of the first comparator 106 is communicatively coupled to a positive input port of the operational amplifier 102 via a first reference resistor Rf1, and the output port of the second comparator 108 is further communicatively coupled to a negative input port of the operational amplifier 102 via a second reference resistor Rf2.

The first inverter 110 is communicatively coupled to the first comparator 106 and configured to output an inverted negative output voltage Von_inv by inverting the first decision result Von. A second inverter 112 is communicatively coupled to the second comparator 108 and configured to output an inverted positive output voltage Vop_inv by inverting the second decision result Vop.

Further, an output port of the first inverter 110 is communicatively coupled to both a positive input port of the operational amplifier 102 via a first resistor R1 and connected to a negative input port of the operational amplifier 102 via a fourth resistor R4 and configured to feed the first inverted output Von_inv back to the positive input port of the operational amplifier 102 and the negative input port of the operational amplifier 102. An output port of the second inverter 112 is communicatively coupled to both the positive input port of the operational amplifier 102 via a second resistor R2 and connected to the negative input port of the operational amplifier 102 via a third resistor R3 and configured to feed the second inverted output Vop_inv back to the positive input port of the operational amplifier 102 and the negative input port of the operational amplifier 102.

Further, the first capacitor C1 is coupled between the negative output port of the operational amplifier 102 and the positive input port of the operational amplifier 102. The second capacitor C2 is coupled between the positive output port of the operational amplifier 102 and the negative input port of the operational amplifier 102.

In practice, the input signal opp and opn may have common mode components, which means that where the signal is transferred by differential voltages, the common-mode signal is a half-sum of voltages, that is $Vcm = \frac{1}{2} \times (Vopp+Vopn)$. The common mode component will cause an error in the measurement of the signals, therefore it is desirable to decrease or eliminate common mode components. With the introduction of the first resistor R1, the second resistor R2, the third resistor R3 and the fourth resistor R4, common-mode jitter can be reduced.

Figure 5A:
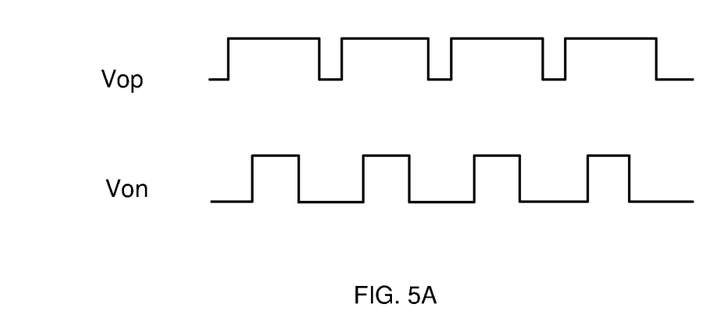
FIG. 5A-FIG. 5E respectively illustrate different wave diagram based on different input voltages.
Figure 5B:
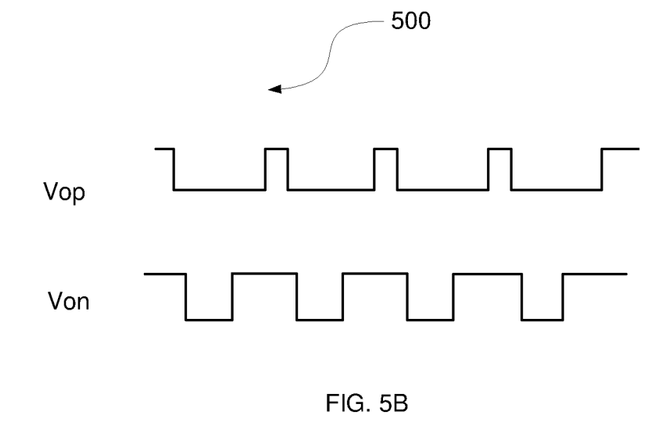
Figure 5C:
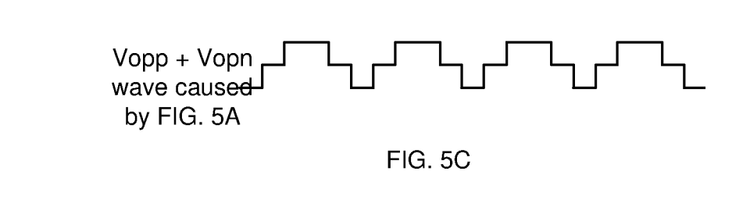

FIGS. 5A, 5B, 5C, 5D, and 5E respectively illustrate wave diagrams based on different input voltages. For example, FIG. 5A illustrates voltage wave of the first decision result Von and the second decision result Vop respectively. The first and the second decision results Von and Vop are also the output of the power amplifier 100. Both the first and the second decision results Von and Vop are fed back to the positive input and the negative input of the operational amplifier 102 respectively via a first reference resistor Rf1 and a second reference resistor Rf2. FIG. 5C represents a wave form of a common mode component of the positive input Vopp of the operational amplifier 102 and the negative input Vopn of the operational amplifier 102 caused by the first decision result Von and the second decision result Vop without considering the first inverted output Von_inv and the second inverted output Vop_inv, that is ½×(Vopp+Vopn).

Figure 5D:
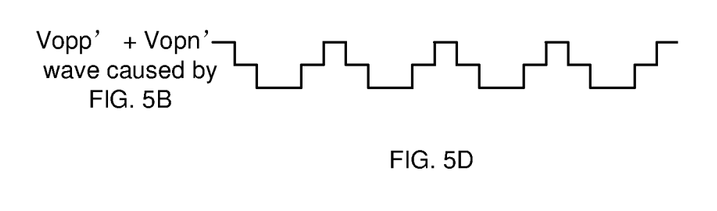

Similarly, FIG. 5B illustrates voltage wave of the first inverted output Von_inv and the second inverted output Vop_inv respectively. The first inverted output Von_inv and the second inverted output Vop_inv. The first inverted output Von_inv is fed back to both the positive input and the negative input of the operational amplifier 102 respectively via the first resistor R1 and the fourth resistor R4. The second inverted output Vop_inv is fed back to both the positive input and the negative input of the operational amplifier 102 respectively via the second resistor R2 and the third resistor R3. Alternatively, R1=R2=R3=R4=2×Rf. FIG. 5D represents a wave form of a common mode component of the positive input Vopp' of the operational amplifier 102 and the negative input Vopn' of the operational amplifier 102 caused by the first inverted output Von_inv and the second inverted output Vop_inv without considering the first decision result Von and the second decision result Vop, that is ½×(Vopp'+Vopn'). FIG. 5C and FIG. 5D show common mode input jitters caused by the signals in FIG. 5A and FIG. 5D respectively.

Figure 5E:
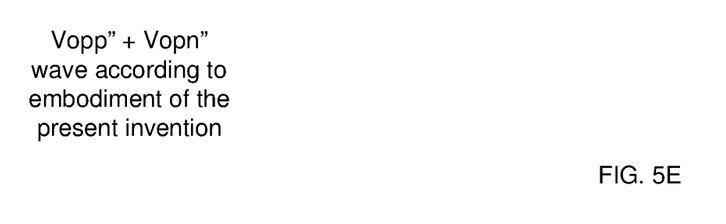

FIG. 5E illustrates a wave diagram according to an embodiment. FIG. 5E represents a wave form of a common mode component of the positive input Vopp" of the operational amplifier 102 and the negative input Vopn" of the operational amplifier 102 caused by the combination of the first inverted output Von_inv and the second inverted output Vop_inv and the first decision result Von and the second decision result Vop, that is ½×(Vopp"+Vopn"). The waveform of FIG. 5C and the waveform of FIG. 5D are complementary, therefore the waveform of FIG. 5E, which equals the sum of the waveforms of FIG. 5C and FIG. 5D, results in at least reduction or complete elimination of the common mode input jitter.

Figure 2:
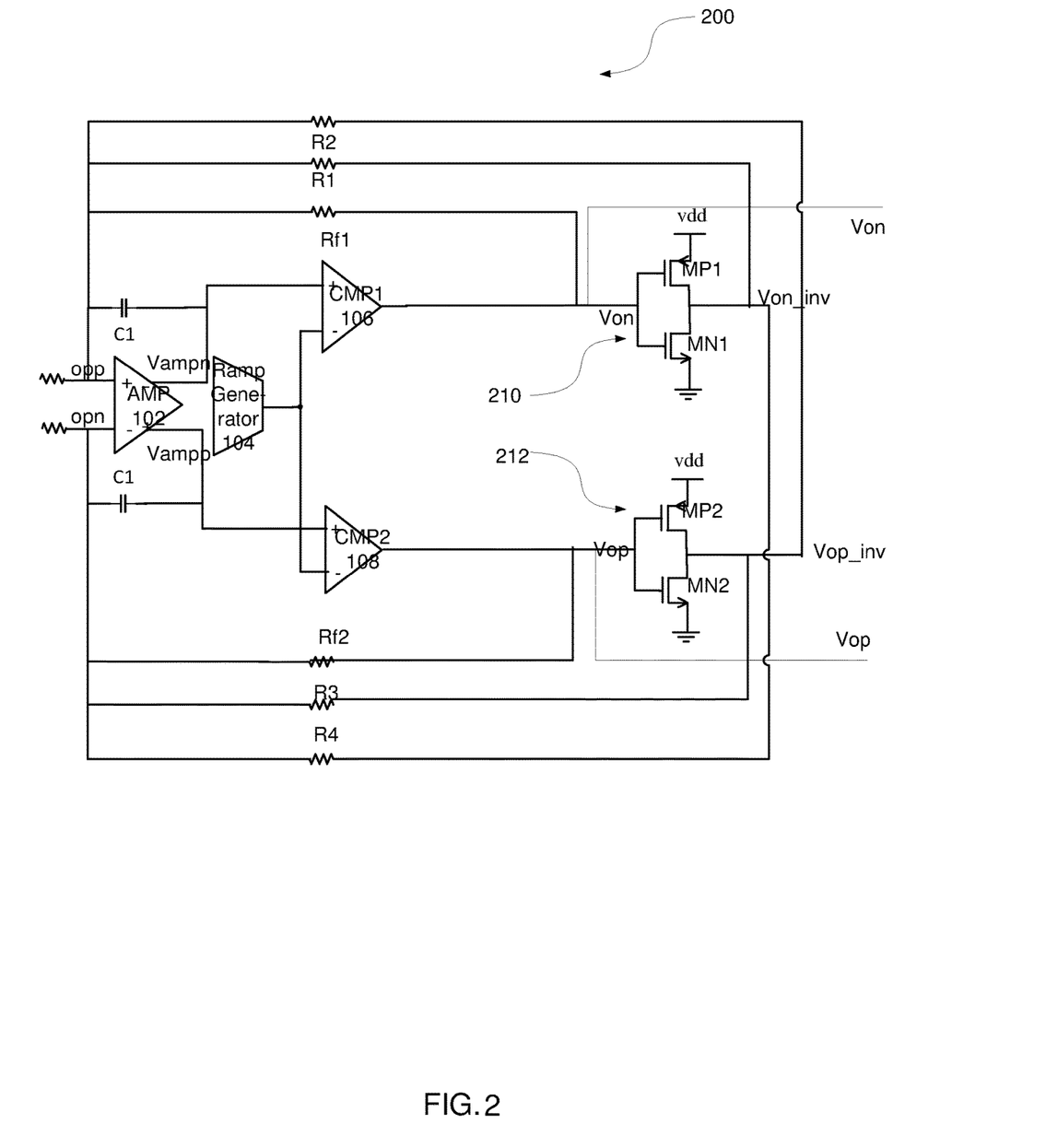
FIG. 2 a more detailed circuit diagram of the power amplifier shown in FIG. 1.

FIG. 2 shows a more detailed circuit diagram of the power amplifier 100 shown in FIG. 1. The first inverter 110 in FIG. 1 can be implemented as the first inverter 210 in FIG. 2, and the second inverter 112 in FIG. 1 can be implemented as the second inverter 212 in FIG. 2. The first inverter 210 comprises a first PMOS transistor MP1 and a first NMOS transistor MN1, and the second inverter 212 comprises a second PMOS transistor MP2 and a second NMOS transistor MN2. A source of the first PMOS transistor MP1 is connected to the power supply Vdd, and a gate of the first PMOS transistor MP1 is connected to an output of the first comparator 106, and a drain of the first PMOS transistor MP1 is connected to a drain of the first NMOS transistor MN1, to both the positive input port opp of the operational amplifier 102 via the first resistor R1 and the negative input port opn of the operational amplifier 102 via the fourth resistor R4. A gate of the first NMOS transistor MN1 is connected to the output of the first comparator 106, and a source of the first NMOS transistor MN1 is connected to the ground GND.

A source of the second PMOS transistor MP2 is connected to the power supply Vdd, and a gate of the second PMOS transistor MP2 is connected to an output of the second comparator 108, and a drain of the second PMOS transistor MP2 is connected to a drain of the second NMOS transistor MN2, to both the positive input port opp of the operational amplifier 102 via the second resistor R2 and the negative input port opn of the operational amplifier 102 via the third resistor R3. A gate of the second NMOS transistor MN2 is connected to the output of the second comparator 108, and a source of the second NMOS transistor MN2 is connected to the ground GND.

Figure 3:
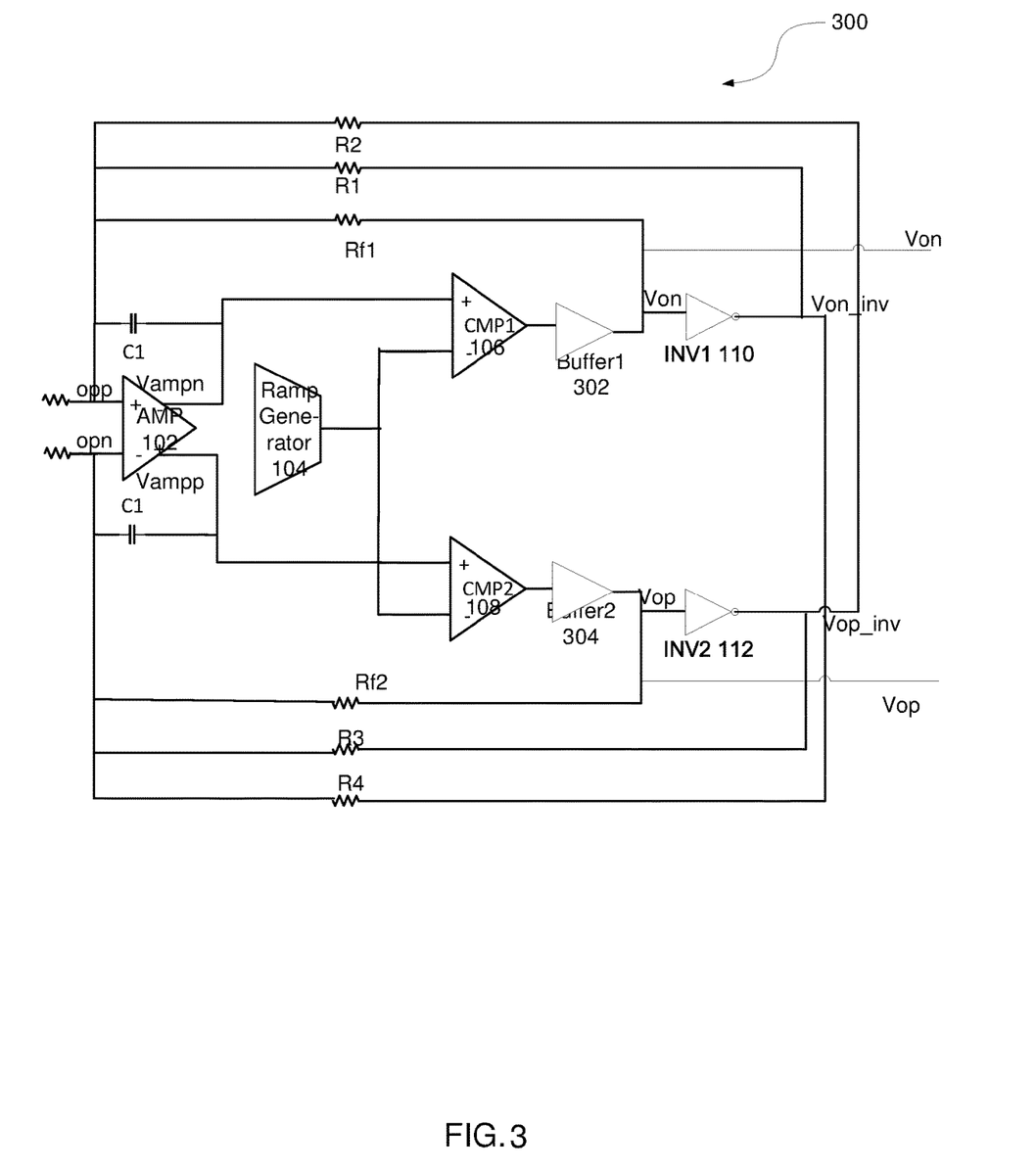
FIG. 3 is a circuit diagram of a power amplifier according to another embodiment.

FIG. 3 is a circuit diagram of a power amplifier 300 according to another embodiment. The power amplifier further comprises a first buffer 302 communicatively coupled to an output of the first comparator 106 and the first inverter 110 and configured to generate a negative output voltage Von by buffering the first decision result output by the first comparator 106. Unlike in FIG. 1 wherein the output of the first comparator 106 is represented as Von, in the embodiment shown in FIG. 3, the output of the first buffer 302 is represented as the Von. The power amplifier 300 further comprises a second buffer 304 communicatively coupled to an output of the second comparator 108 and the second inverter 112 and configured to generate a positive output voltage Vop by buffering the second decision result output by the second comparator 108. Similarly, unlike in FIG. 1 wherein the output of the second comparator 108 is represented as Vop, in the embodiment shown in FIG. 3, the output of the second buffer 304 is represented as the Vop.

The first inverter 110 is further configured to output the inverted negative output voltage Von_inv by inverting the negative output voltage Von; and the second inverter 112 is further configured to output the inverted positive output voltage Vop_inv by inverting the positive output voltage Vop.

Further, the output port of the first buffer 302 is further communicatively coupled to a positive input port of the operational amplifier 102 via the first reference resistor Rf1, and the output port of the second buffer 304 is further communicatively coupled to a negative input port of the operational amplifier 102 via a second reference resistor Rf2.

With the first buffer 302 and the second buffer 304, the driving power of the power amplifier 300 can be increased. Note the first buffer 302 and the second buffer 304 can be omitted if the first comparator 106 and the second comparator 108 have sufficient driving power.

Further, the first capacitor C1 is coupled between the negative output port of the operational amplifier 102 and the positive input port of the operational amplifier 102. The second capacitor C2 is coupled between the positive output port of the operational amplifier 102 and the negative input port of the operational amplifier 102.

Figure 4:
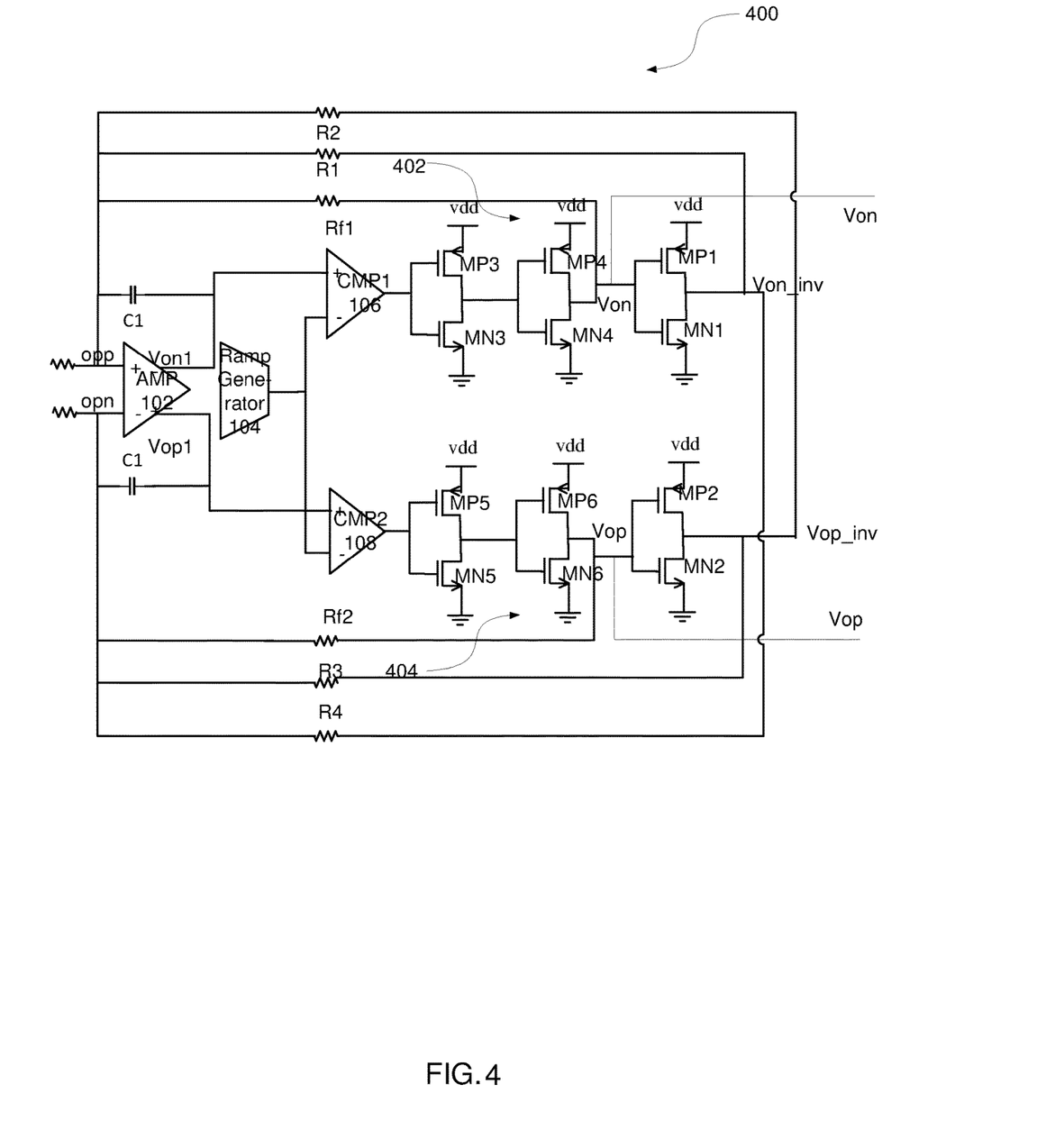
FIG. 4 a more detailed circuit diagram of the power amplifier shown in FIG. 3.

FIG. 4 is a more detailed circuit diagram of the power amplifier 300 shown in FIG. 3. The first buffer 302 and the second buffer 304 in FIG. 3 are respectively shown as the first buffer 402 and the second buffer 404 in FIG. 4. The first buffer 402 comprises a third PMOS transistor MP3, a third NMOS transistor MN3, a fourth PMOS transistor MP4 and a fourth NMOS transistor MN4. A source of the third PMOS transistor MP3 is connected to a power supply Vdd, and a gate of the third PMOS transistor MP3 is connected to the output of the first comparator 106, and a drain of the third PMOS transistor MP3 is connected to a drain of the third NMOS transistor MN3, a gate of the fourth PMOS transistor MP4 and a gate of the fourth NMOS transistor MN4. A gate of the third NMOS transistor MN3 is connected to the output of the first comparator 106, and a source of the third NMOS transistor MN3 is connected to a ground GND. A source of the fourth PMOS transistor MP4 is connected to the power supply Vdd, and a drain of the fourth PMOS transistor MP4 is connected to a drain of the fourth NMOS transistor MN4 and configured to output the negative output voltage Von. A source of the fourth NMOS transistor MN4 is connected to the ground.

Further, the second buffer 404 comprises a fifth PMOS transistor MP5, a fifth NMOS transistor MN5, a sixth PMOS transistor MP6 and a sixth NMOS transistor MN6. A source of the fifth PMOS transistor MP5 is connected to a power supply Vdd, and a gate of the fifth PMOS transistor MP5 is connected to the output of the second comparator 108, and a drain of the fifth PMOS transistor MP5 is connected to a drain of the fifth NMOS transistor MN5, a gate of the sixth PMOS transistor MP6 and a gate of the sixth NMOS transistor MN6. A gate of the fifth NMOS transistor MN5 is connected to the output of the second comparator 108, and a source of the fifth NMOS transistor MN5 is connected to a ground GND. A source of the sixth PMOS transistor MP6 is connected to the power supply Vdd, and a drain of the sixth PMOS transistor MP6 is connected to a drain of the sixth NMOS transistor MN6 and configured to output the positive output voltage Vop. A source of the sixth NMOS transistor MN6 is connected to the ground GND.

Alternatively, the ramp generator 104 is a triangle wave generator. Alternatively, the ramp generator is a jigsaw wave generator.

Figure 6:
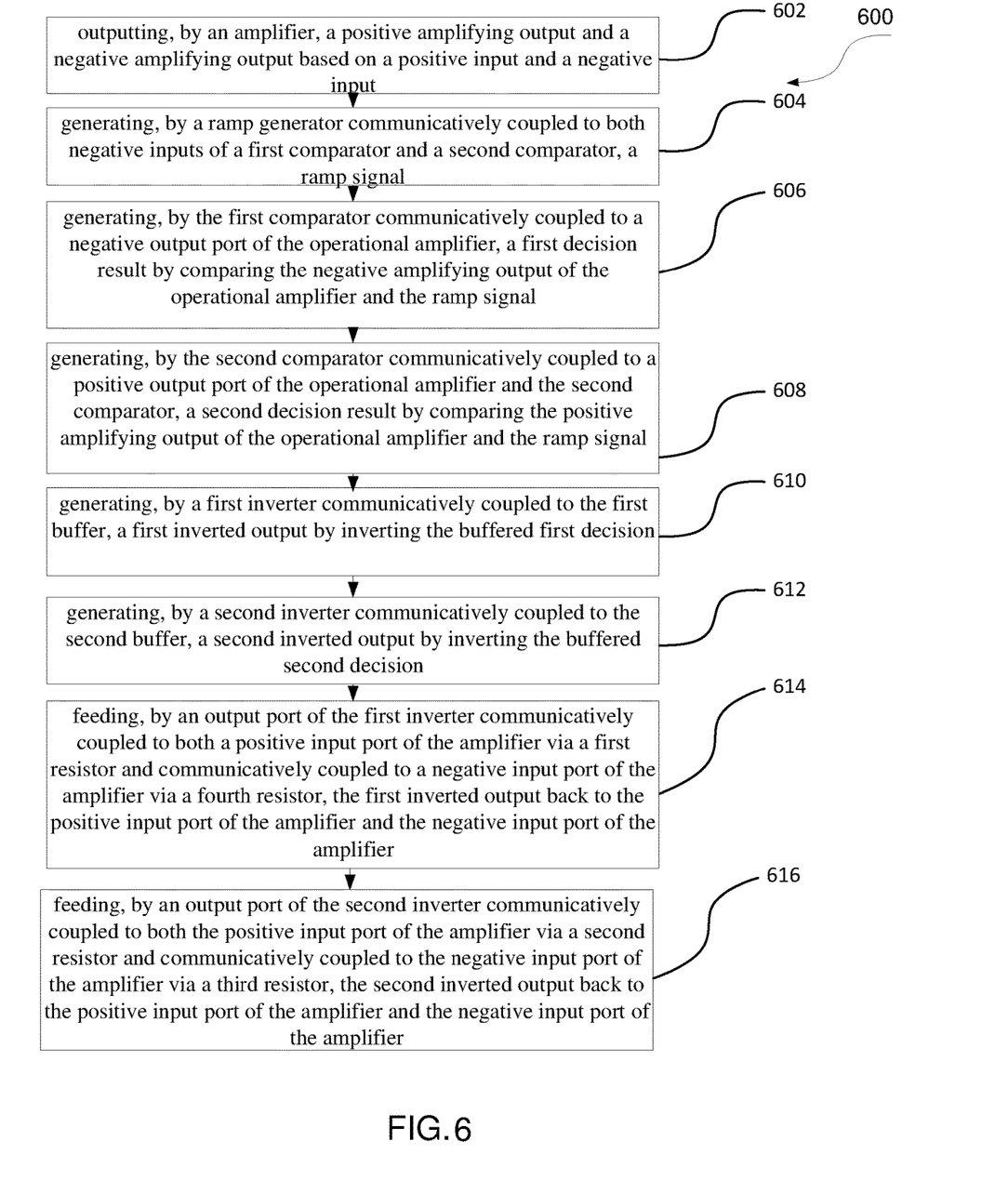
FIG. 6 is a flow chart illustrating a method for operating the power amplifier according to an embodiment.

FIG. 6 is a flow chart illustrating a method 600 for operating the power amplifier according to an embodiment.

The method 600 of operating a power amplifier comprises outputting in block 602, by an operational amplifier, a positive amplifying output and a negative amplifying output based on a positive input and a negative input; generating in block 604, by a ramp generator communicatively coupled to both negative inputs of a first comparator and a second comparator, a ramp signal; generating in block 606, by the first comparator communicatively coupled to a negative output port of the operational amplifier, a first decision result by comparing the negative amplifying output of the operational amplifier and the ramp signal; generating in block 608, by the second comparator communicatively coupled to a positive output port of the operational amplifier and the second comparator, a second decision result by comparing the positive amplifying output of the operational amplifier and the ramp signal; generating in block 610, by a first inverter communicatively coupled to the first comparator, a first inverted output by inverting the first decision result; generating in block 612, by a second inverter communicatively coupled to the second comparator, a second inverted output by inverting the second decision result; feeding in block 614, by an output port of the first inverter communicatively coupled to both a positive input port of the operational amplifier via a first resistor and communicatively coupled to a negative input port of the operational amplifier via a fourth resistor, the first inverted output back to the positive input port of the operational amplifier and the negative input port of the operational amplifier; and feeding in block 616, by an output port of the second inverter communicatively coupled to both the positive input port of the operational amplifier via a second resistor and communicatively coupled to the negative input port of the operational amplifier via a third resistor, the second inverted output back to the positive input port of the operational amplifier and the negative input port of the operational amplifier.

Alternatively, the first inverter comprises a first PMOS transistor and a first NMOS transistor, and the second inverter comprises a second PMOS transistor and a second NMOS transistor; a source of the first PMOS transistor is connected to the power supply Vdd, and a gate of the first PMOS transistor is connected to an output of the first comparator, and a drain of the first PMOS transistor is connected to a drain of the first NMOS transistor, to both the positive input port of the operational amplifier via the first resistor and the negative input port of the operational amplifier via the fourth resistor; a gate of the first NMOS transistor is connected to the output of the first comparator, and a source of the first NMOS transistor is connected to the ground; a source of the second PMOS transistor is connected to the power supply Vdd, and a gate of the second PMOS transistor is connected to an output of the second comparator, and a drain of the second PMOS transistor is connected to a drain of the second NMOS transistor, to both the positive input port of the operational amplifier via the second resistor and the negative input port of the operational amplifier via the third resistor; and a gate of the second NMOS transistor is connected to the output of the second comparator, and a source of the second NMOS transistor is connected to the ground.

Figure 7:
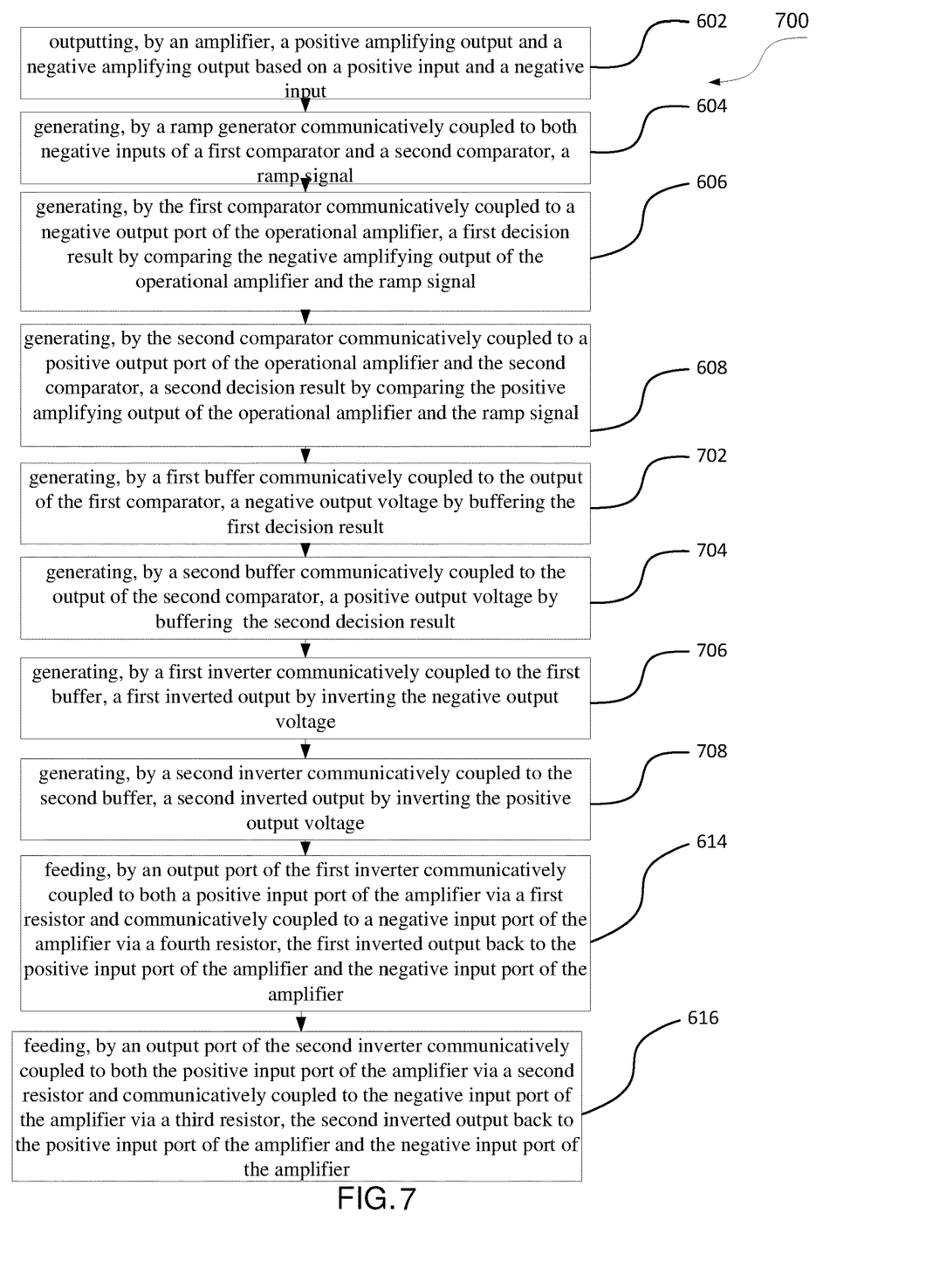
FIG. 7 is a flow chart illustrating a method for operating the power amplifier according to another embodiment.

FIG. 7 is a flow chart illustrating a method 700 for operating the power amplifier according to another embodiment.

In addition to blocks 602, 604, 606, 608, 614 and 616 discussed with respect to FIG. 6, the method 700 further comprises generating in block 702, by a first buffer communicatively coupled to the output of the first comparator, a negative output voltage by buffering the first decision result; generating in block 704, by a second inverter communicatively coupled to the output of the second comparator, a positive output voltage by buffering the second decision result; generating in block 706, by the first inverter communicatively coupled to the first buffer, a first inverted output by inverting the negative output voltage; and generating in block 708, by a second inverter communicatively coupled to the second buffer, a second inverted output by inverting the positive output voltage.

Alternatively, the first buffer comprises a third PMOS transistor, a third NMOS transistor, a fourth PMOS transistor and a fourth NMOS transistor, wherein a source of the third PMOS transistor is connected to a power supply Vdd, and a gate of the third PMOS transistor is connected to the output of the first comparator, and a drain of the third PMOS transistor is connected to a drain of the third NMOS transistor, a gate of the fourth PMOS transistor and a gate of the fourth NMOS transistor; a gate of the third NMOS transistor is connected to the output of the first comparator, and a source of the third NMOS transistor is connected to a ground;

a source of the fourth PMOS transistor is connected to the power supply Vdd, and a drain of the fourth PMOS transistor is connected to a drain of the fourth NMOS transistor and configured to output the negative output voltage; and a source of the fourth NMOS transistor is connected to the ground.

Alternatively, the second buffer comprises a fifth PMOS transistor, a fifth NMOS transistor, a sixth PMOS transistor and a sixth NMOS transistor, wherein a source of the fifth PMOS transistor is connected to a power supply Vdd, and a gate of the fifth PMOS transistor is connected to the output of the second comparator, and a drain of the fifth PMOS transistor is connected to a drain of the fifth NMOS transistor, a gate of the sixth PMOS transistor and a gate of the sixth NMOS transistor; a gate of the fifth NMOS transistor is connected to the output of the second comparator, and a source of the fifth NMOS transistor is connected to a ground; a source of the sixth PMOS transistor is connected to the power supply Vdd, and a drain of the sixth PMOS transistor is connected to a drain of the sixth NMOS transistor and configured to output the positive output voltage; and a source of the sixth NMOS transistor is connected to the ground.

Alternatively, the output port of the first comparator is further communicatively coupled to a positive input port of the operational amplifier, and the output port of the second comparator is further communicatively coupled to a positive input port of the operational amplifier.

Alternatively, the output port of the first buffer is further communicatively coupled to a positive input port of the operational amplifier, and the output port of the second buffer is further communicatively coupled to a positive input port of the operational amplifier.

Alternatively, the ramp generator is a triangle wave generator.

Alternatively, the ramp generator is a jigsaw wave generator.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present disclosure. Moreover, features of one embodiment may be incorporated into other embodiments, even where those features are not described together in a single embodiment within the present document. Accordingly, the disclosure is described by the appended claims.

What is claimed is:

1. A power amplifier, comprising:
    an operational amplifier configured to output a positive amplifying output and a negative amplifying output based on a positive input and a negative input;
    a ramp generator communicatively coupled to both negative inputs of a first comparator and a second comparator, and configured to generate a ramp signal;
    a positive input port of the first comparator is further communicatively coupled to a negative output port of the operational amplifier and the first comparator is further configured to generate a first decision result by comparing the first negative output of the operational amplifier and the ramp signal;
    a positive input port of the second comparator is further communicatively coupled to a positive output port of the operational amplifier and the second comparator is further configured to generate a second decision result by comparing the first positive output of the operational amplifier and the ramp signal;
    a first inverter communicatively coupled to the first comparator and configured to output a first inverted output by inverting the first decision result;
    a second inverter communicatively coupled to the second comparator and configured to output a second inverted output by inverting the second decision result;
    an output port of the first inverter is communicatively coupled to both the positive input port of the operational amplifier via a first resistor and connected to the negative input port of the operational amplifier via a fourth resistor and configured to feed the first inverted output back to the positive input port of the operational amplifier and the negative input port of the operational amplifier; and
    an output port of the second inverter is communicatively coupled to both the positive input port of the operational amplifier via a second resistor and connected to the negative input port of the operational amplifier via a third resistor and configured to feed the second inverted output back to the positive input port of the operational amplifier and the negative input port of the operational amplifier.

2. The power amplifier of claim 1, wherein the first inverter comprises a first PMOS transistor and a first NMOS transistor, and the second inverter comprises a second PMOS transistor and a second NMOS transistor;
    a source of the first PMOS transistor is connected to a power supply, and a gate of the first PMOS transistor is connected to an output of the first comparator, and a drain of the first PMOS transistor is connected to a drain of the first NMOS transistor, to both the positive input port of the operational amplifier via the first resistor and the negative input port of the operational amplifier via the fourth resistor;
    a gate of the first NMOS transistor is connected to the output of the first comparator, and a source of the first NMOS transistor is connected to the ground;
    a source of the second PMOS transistor is connected to the power supply, and a gate of the second PMOS transistor is connected to an output of the second comparator, and a drain of the second PMOS transistor is connected to a drain of the second NMOS transistor, to both the positive input port of the operational amplifier via the second resistor and the negative input port of the operational amplifier via the third resistor; and
    a gate of the second NMOS transistor is connected to the output of the second comparator, and a source of the second NMOS transistor is connected to the ground.

3. The power amplifier of claim 1, further comprising
    a first buffer communicatively coupled to an output of the first comparator and the first inverter and configured to generate a negative output voltage by buffering the first decision result;
    a second buffer communicatively coupled to an output of the second comparator and the second inverter and configured to generate a positive output voltage by buffering the second decision result;
    wherein the first inverter is further configured to output the first inverted output by inverting the negative output voltage; and
    the second inverter is further configured to output the second inverted output by inverting the positive output voltage.

4. The power amplifier of claim 3, wherein the first buffer comprises a third PMOS transistor, a third NMOS transistor, a fourth PMOS transistor and a fourth NMOS transistor, wherein
    a source of the third PMOS transistor is connected to the power supply, and a gate of the third PMOS transistor is connected to the output of the first comparator, and a drain of the third PMOS transistor is connected to a drain of the third NMOS transistor, a gate of the fourth PMOS transistor and a gate of the fourth NMOS transistor;
    a gate of the third NMOS transistor is connected to the output of the first comparator, and a source of the third NMOS transistor is connected to a ground;
    a source of the fourth PMOS transistor is connected to the power supply, and a drain of the fourth PMOS transistor is connected to a drain of the fourth NMOS transistor and configured to output the negative output voltage; and
    a source of the fourth NMOS transistor is connected to the ground.

5. The power amplifier of claim 4, wherein the second buffer comprises a fifth PMOS transistor, a fifth NMOS transistor, a sixth PMOS transistor and a sixth NMOS transistor, wherein a source of the fifth PMOS transistor is connected to the power supply, and a gate of the fifth PMOS transistor is connected to the output of the second comparator, and a drain of the fifth PMOS transistor is connected to a drain of the fifth NMOS transistor, a gate of the sixth PMOS transistor and a gate of the sixth NMOS transistor;

a gate of the fifth NMOS transistor is connected to the output of the second comparator, and a source of the fifth NMOS transistor is connected to a ground;

a source of the sixth PMOS transistor is connected to the power supply, and a drain of the sixth PMOS transistor is connected to a drain of the sixth NMOS transistor and configured to output the positive output voltage; and a source of the sixth NMOS transistor is connected to the ground.

6. The power amplifier of claim 3, wherein the output port of the first buffer is further communicatively coupled to a positive input port of the operational amplifier, and the output port of the second buffer is further communicatively coupled to a positive input port of the operational amplifier.

7. The power amplifier of claim 1, wherein the output port of the first comparator is further communicatively coupled to the positive input port of the operational amplifier via a first reference resistor, and the output port of the second comparator is further communicatively coupled to the positive input port of the operational amplifier via a second reference resistor.

8. The power amplifier of claim 1, wherein the ramp generator is a triangle wave generator.

9. The power amplifier of claim 1, wherein the ramp generator is a jigsaw wave generator.

10. A method of operating a power amplifier, comprising:
outputting, by an operational amplifier, a positive amplifying output and a negative amplifying output based on a positive input and a negative input;

generating, by a ramp generator communicatively coupled to both negative inputs of a first comparator and a second comparator, a ramp signal;

generating, by the first comparator communicatively coupled to a negative output port of the operational amplifier, a first decision result by comparing the negative amplifying output of the operational amplifier and the ramp signal;

generating, by the second comparator communicatively coupled to a positive output port of the operational amplifier and the second comparator, a second decision result by comparing the positive amplifying output of the operational amplifier and the ramp signal;

generating, by a first inverter communicatively coupled to the first comparator, a first inverted output by inverting the first decision result;

generating, by a second inverter communicatively coupled to the second comparator, a second inverted output by inverting the second decision result;

feeding, by an output port of the first inverter communicatively coupled to both a positive input port of the operational amplifier via a first resistor and communicatively coupled to a negative input port of the operational amplifier via a fourth resistor, the first inverted output back to the positive input port of the operational amplifier and the negative input port of the operational amplifier; and feeding, by an output port of the second inverter communicatively coupled to both the positive input port of the operational amplifier via a second resistor and communicatively coupled to the negative input port of the operational amplifier via a third resistor, the second inverted output back to the positive input port of the operational amplifier and the negative input port of the operational amplifier.

11. The method of claim 10, wherein the first inverter comprises a first PMOS transistor and a first NMOS transistor, and the second inverter comprises a second PMOS transistor and a second NMOS transistor;

a source of the first PMOS transistor is connected to a power supply, and a gate of the first PMOS transistor is connected to an output of the first comparator, and a drain of the first PMOS transistor is connected to a drain of the first NMOS transistor, to both the positive input port of the operational amplifier via the first resistor and the negative input port of the operational amplifier via the fourth resistor;

a gate of the first NMOS transistor is connected to the output of the first comparator, and a source of the first NMOS transistor is connected to the ground;

a source of the second PMOS transistor is connected to the power supply, and a gate of the second PMOS transistor is connected to an output of the second comparator, and a drain of the second PMOS transistor is connected to a drain of the second NMOS transistor, to both the positive input port of the operational amplifier via the second resistor and the negative input port of the operational amplifier via the third resistor; and a gate of the second NMOS transistor is connected to the output of the second comparator, and a source of the second NMOS transistor is connected to the ground.

12. The method of claim 10, further comprising:

generating and outputting, by a first buffer communicatively coupled to the output of the first comparator, a negative output voltage by buffering the first decision result;

generating and outputting, by a second buffer communicatively coupled to the output of the second comparator, a positive output voltage by buffering the second decision result;

generating, by the first inverter communicatively coupled to the first buffer, a first inverted output by inverting the negative output voltage;

generating, by a second inverter communicatively coupled to the second comparator, a second inverted output by inverting the positive output voltage.

13. The method of claim 12, wherein the first buffer comprises a third PMOS transistor, a third NMOS transistor, a fourth PMOS transistor and a fourth NMOS transistor, wherein a source of the third PMOS transistor is connected to the power supply, and a gate of the third PMOS transistor is connected to the output of the first comparator, and a drain of the third PMOS transistor is connected to a drain of the third NMOS transistor, a gate of the fourth PMOS transistor and a gate of the fourth NMOS transistor;

a gate of the third NMOS transistor is connected to the output of the first comparator, and a source of the third NMOS transistor is connected to a ground;

a source of the fourth PMOS transistor is connected to the power supply, and a drain of the fourth PMOS transistor is connected to a drain of the fourth NMOS transistor and configured to output the negative output voltage; and a source of the fourth NMOS transistor is connected to the ground.

14. The method of claim 13, wherein the second buffer comprises a fifth PMOS transistor, a fifth NMOS transistor, a sixth PMOS transistor and a sixth NMOS transistor, wherein a source of the fifth PMOS transistor is connected to the power supply, and a gate of the fifth PMOS transistor is connected to the output of the second comparator, and a drain of the fifth PMOS transistor is connected to a drain of the fifth NMOS transistor, a gate of the sixth PMOS transistor and a gate of the sixth NMOS transistor;

a gate of the fifth NMOS transistor is connected to the output of the second comparator, and a source of the fifth NMOS transistor is connected to a ground;

a source of the sixth PMOS transistor is connected to the power supply, and a drain of the sixth PMOS transistor is connected to a drain of the sixth NMOS transistor and configured to output the positive output voltage; and a source of the sixth NMOS transistor is connected to the ground.

15. The method of claim 12, wherein the output port of the first buffer is further communicatively coupled to the positive input port of the operational amplifier, and the output port of the second buffer is further communicatively coupled to the positive input port of the operational amplifier.

16. The method of claim 10, wherein the output port of the first comparator is further communicatively coupled to the positive input port of the operational amplifier via a first reference resistor, and the output port of the second comparator is further communicatively coupled to the positive input port of the operational amplifier via a second reference resistor.

17. The method of claim 10, wherein the ramp generator is a triangle wave generator.

18. The method of claim 10, wherein the ramp generator is a jigsaw wave generator.

\* \* \* \* \*